United States Patent
Nishikubo et al.

(10) Patent No.: US 6,844,130 B2
(45) Date of Patent: Jan. 18, 2005

(54) PHOTOCURABLE/THERMOSETTING RESIN COMPOSITION, PHOTOSENSITIVE DRY FILM FORMED THEREFROM, AND METHOD OF FORMING PATTERN WITH THE SAME

(75) Inventors: Tadatomi Nishikubo, Fujisawa (JP); Atsushi Kameyama, Yokohama (JP); Masaki Sasaki, Asaka (JP); Masatoshi Kusama, Sakaido (JP); Seiya Onodera, Sayama (JP)

(73) Assignees: Kanagawa University (JP); Taiyo Ink Manufacturing Co., Ltd. (JP)

( * ) Notice: Subject to any disclaimer, the term of this patent is extended or adjusted under 35 U.S.C. 154(b) by 0 days.

(21) Appl. No.: 10/256,009

(22) Filed: Sep. 27, 2002

(65) Prior Publication Data

US 2004/0023120 A1 Feb. 5, 2004

Related U.S. Application Data

(63) Continuation of application No. PCT/JP01/02590, filed on Mar. 28, 2001, now abandoned.

(30) Foreign Application Priority Data

Mar. 29, 2000 (JP) .......................................... 2000-90906
Dec. 7, 2000 (JP) ....................................... 2000-373410

(51) Int. Cl.$^7$ ............................. G03F 7/30; G03F 7/028
(52) U.S. Cl. ..................... 430/258; 430/260; 430/280.1
(58) Field of Search ............................. 430/280.1, 260, 430/258

(56) References Cited

U.S. PATENT DOCUMENTS

| | | | | |
|---|---|---|---|---|
| 4,318,975 A | * | 3/1982 | Kuznetsov et al. | ......... 430/160 |
| 6,190,833 B1 | * | 2/2001 | Shiota et al. | ............ 430/280.1 |
| 2003/0153723 A1 | * | 8/2003 | Nishibuko et al. | .......... 528/327 |

FOREIGN PATENT DOCUMENTS

| | | | |
|---|---|---|---|
| EP | 1 275 665 A1 | * | 1/2003 |
| JP | 01-203424 | | 8/1989 |
| JP | 07-330865 | | 12/1995 |
| JP | 11-065116 | | 3/1999 |
| JP | 11-106380 | | 4/1999 |
| JP | 11-246541 | | 9/1999 |
| JP | 11-322944 | | 11/1999 |
| JP | 11-343346 | | 12/1999 |
| WO | WO-02/2373-a2 | * | 9/2001 |
| WO | WO-01/72857 A1 | * | 10/2001 |
| WO | WO-01/72857-a1 | * | 10/2001 |

OTHER PUBLICATIONS

Publication No. 09255741, publication date Sep. 30, 1997, Applicant Tamura Kaken KK, one page English Abstract of JP 09–25574 copyright 1997 Patent Abstracts of Japan, JPO(presented by applicants).*
Machine Translation into English from Japanese Patent Office website www19.ipdl.jpo.go.jp of JP 09–255741, 28 pages submitted by applicant.*
Kazuaki et al, machine translation of JP 11–065116 translated by machine online translation from Japan Patent Office, 23 pag and English Abstract already cited by applicants date of publication Mar. 1999.*
International Search Report no further information cited.
International Preliminary Examination Report Jan. 31, 2002.
Supplemental European Search Report dated Mar. 27, 2003.

* cited by examiner

*Primary Examiner*—Cynthis Hamilton
(74) *Attorney, Agent, or Firm*—Rader, Fishman & Grauer PLLC

(57) ABSTRACT

A photocurable and thermosetting resin composition comprising (A) a photosensitive prepolymer having a carboxyl group in combination with at least two ethylenically unsaturated double bonds in its molecule, (B) a polymerization initiator, (C) a diluent, (D) an oxetane compound having at least two oxetanyl groups in its molecule, and (E) a curing promotor is developable with an alkaline solution and can be formulated as a one package preparation. Such a photocurable and thermosetting resin composition and a photosensitive dry film prepared by the use thereof are useful as various resist materials and electrical insulating materials, particularly as solder resists for printed circuit boards, interlaminar insulating materials for build-up multi-layer printed circuit boards, and the like.

5 Claims, No Drawings

PHOTOCURABLE/THERMOSETTING RESIN COMPOSITION, PHOTOSENSITIVE DRY FILM FORMED THEREFROM, AND METHOD OF FORMING PATTERN WITH THE SAME

CROSS-REFERENCE TO RELATED APPLICATIONS

This is a continuation of Application PCT/JP01/02590, filed Mar. 28, 2001, now abandoned.

BACKGROUND OF THE INVENTION

1. Field of the Invention

This invention relates to a photocurable and thermosetting resin composition and a photosensitive dry film formed from the composition, and more particularly relates to a photocurable and thermosetting resin composition which is suitable for the formation of a solder resist etc. in a household grade printed circuit board and an industrial grade printed circuit board and a photosensitive dry film which is suitable for various applications such as the production of circuit boards and the mounting of the electronic parts. This invention relates further to a method for forming a pattern by the use of the photocurable and thermosetting resin composition and the photosensitive dry film mentioned above.

2. Description of the Prior Art

In the household grade printed circuit boards and the industrial grade printed circuit boards, generally a solder resist is formed before supplying a solder during the step of mounting electronic parts for the purpose of preventing molten solder from adhering to irrelevant portions and protecting circuits. As a resin composition for this solder resist, a developing type solder resist composition which is used to form a pattern by a photolithographic method is widely adopted from the viewpoint of ensuring highly accurate formation of circuits with high density. Particularly, with due respect to the problem of environmental safety and from the viewpoint of cost, the solder resist composition of the alkali developing type which implements development with a dilute aqueous alkaline solution has come to play the leading role.

Such a solder resist composition usually contains a polyfunctional epoxy compound having two or more epoxy groups as a thermosetting component for the purpose of improving the resistance to soldering heat. However, since the polyfunctional epoxy compound exhibits high reactivity, the photocurable and thermosetting resin composition containing this compound exhibits unduly short shelf life (useful life) and is liable to gain in viscosity prior to being applied to a blank circuit board. As a result, it is possible to formulate it as the one-package type only with difficulty. Accordingly, the composition requires to be formulated as the two-package type consisting of a hardener solution containing a polyfunctional epoxy compound as a main component thereof and a main agent solution containing a photosensitive prepolymer as a main component thereof and a curing promotor etc. added thereto. This poses the problem in working properties because it is necessary to mix them immediately prior to use.

Further, when the photocurable and thermosetting resin composition containing the polyfunctional epoxy compound is formed into a dry film, the shelf life (useful life) of this film becomes short and the preservation in the refrigerated state at a temperature of not more than 0° C. is required. That is to say, it is deficient in shelf stability at room temperature. Further, this dry film poses the problem in working properties because increase of its temperature to room temperature is required prior to use thereof.

When the photocurable and thermosetting resin composition containing the polyfunctional epoxy compound is applied to a substrate, exposed to light, developed and then thermally cured, a cured film having excellent properties such as hardness owing to the cross-linking reaction of the polyfunctional epoxy compounds is obtained. However, when the cross-linking reaction unduly proceeds, there is the possibility of causing shrinkage of the coating film on curing and cracks therein.

SUMMARY OF THE INVENTION

An object of the present invention, therefore, is to provide an alkali developing type photocurable and thermosetting resin composition, which is free from such defects as mentioned above, has no possibility of causing shrinkage on curing during the step of thermal curing, is capable of producing a cured film excelling in various properties such as resistance to heat, fastness of adhesion, and electrical insulating properties, thereby capable of improving the insulating reliability, excels in storage stability and thus is capable of being formulated as a one-package preparation.

Another object of the present invention is to provide a photosensitive dry film consisting of an alkali developing type photocurable and thermosetting resin composition, which is capable of producing a cured film excelling in various properties such as resistance to heat, fastness of adhesion, and electrical insulating properties, and allows preservation at room temperature.

Further objects of the present invention are to provide a method of forming a pattern by the use of the photocurable and thermosetting resin composition or the photosensitive dry film as mentioned above and to provide a printed circuit board having a solder resist pattern formed by the method.

To accomplish the objects mentioned above, the first aspect of the present invention consists in providing a photocurable and thermosetting resin composition characterized by comprising (A) a photosensitive prepolymer having a carboxyl group in combination with at least two ethylenically unsaturated double bonds in its molecule, (B) a polymerization initiator, (C) a diluent, (D) an oxetane compound having at least two oxetanyl groups in its molecule, and (E) a curing promotor.

Since the photocurable and thermosetting resin composition mentioned above contains as a thermosetting component a polyfunctional oxetane compound (D) having oxetanyl groups of a four membered ring which react with the carboxyl groups of the photosensitive prepolymer (A) during the step of thermal curing to cause primary hydroxyl groups preponderantly, the resultant cured film is excellent in adhesiveness to a substrate as compared with that obtained by the composition using an epoxy compound which causes secondary hydroxyl groups preponderantly by the reaction with the above prepolymer. Further, since the cured film contains a large number of ethylene units after the reaction because of the four membered ring, it scarcely suffers volume shrinkage and excels in toughness. As a result, there is obtained a cured film which exhibits excellent resistance to cracking. Furthermore, since the reactivity of the polyfunctional oxetane compound is lower than that of the polyfunctional epoxy compound, the photocurable and thermosetting resin composition containing the polyfunctional oxetane compound exhibits longer shelf life (useful life), can be formulated as a one package preparation, and allows formation of a photosensitive dry film excelling in shelf stability at room temperature, which provides various advantages in terms of workability.

In accordance with the second aspect of the present invention, there is provided a photosensitive dry film characterized by comprising a supporting film and at least a dry film layer of the aforementioned photocurable and thermosetting resin composition formed thereon. In a preferred embodiment, a protective film is further laminated on the dry film layer mentioned above.

The photosensitive dry film mentioned above excels in formation of fine patterns and further in various properties such as storage stability, developing properties, resistance to cracking (toughness), fastness of adhesion, and hardness.

The third aspect of the present invention consists in providing a method of forming a pattern. One embodiment thereof is characterized by comprising the steps of tightly superposing the photosensitive dry film mentioned above on a substrate on which a pattern is formed in such a manner that the dry film layer is brought into contact with the substrate, separating the supporting film from the dry film layer, then exposing the layer to light through a patterned mask, and effecting development to remove an unexposed area of the layer. In the case of the photosensitive dry film further containing a protective film laminated on the dry film layer mentioned above, after separating the protective film from the photosensitive dry film, the photosensitive dry film is tightly superposed on a substrate on which a pattern is formed in such a manner that the dry film layer is brought into contact with the substrate as mentioned above, the supporting film is separated from the dry film layer and then this layer is exposed to light and developed in the same manner as mentioned above. When the photocurable and thermosetting resin composition is used, it is applied to a substrate on which a pattern is formed, dried, thereafter exposed to light through a patterned mask, and then subjected to development to remove the unexposed area of the layer. By such methods, it is possible to form a prescribed resin insulating pattern such as a solder resist pattern with good workability.

In accordance with the fourth aspect of the present invention, there is provided a printed circuit board having a solder resist pattern formed thereon in the manner as mentioned above.

DETAILED DESCRIPTION OF THE INVENTION

The present inventors, after continuing a diligent study in search of a method for solving the problems mentioned above, have made the findings that the photocurable and thermosetting resin composition obtained by using a polyfunctional oxetane compound as a thermosetting component in combination with a photosensitive prepolymer having a carboxyl group together with at least two ethylenically unsaturated double bonds in its molecule is developable with an aqueous alkaline solution and, at the same time, can be formulated as a one-package preparation, and that when the coating film of the composition is thermally cured after exposure to light and development, there is obtained a cured film excelling in various properties such as resistance to heat, fastness of adhesion, and electrical insulating properties, without causing any shrinkage on curing. The present inventors have further found that the photocurable and thermosetting resin composition mentioned above allows formation of a photosensitive dry film which can be stored at room temperature and is excellent in shelf life (useful life), and that when the dry film layer (photosensitive layer) of this photosensitive dry film is transferred onto a substrate and thermally cured after exposure to light and development, there is obtained a cured film excelling in various properties such as resistance to heat, fastness of adhesion, and electrical insulating properties, without causing any shrinkage on curing as mentioned above.

Specifically, since the photocurable and thermosetting resin composition of the present invention contains as a thermosetting component an oxetane compound (D) having oxetanyl groups of a four membered ring which react with the carboxyl groups of the photosensitive prepolymer (A) during the step of thermal curing to cause primary hydroxyl groups preponderantly, the resultant cured film is excellent in adhesiveness to a substrate as compared with that obtained by the composition using an epoxy compound which causes secondary hydroxyl groups preponderantly by the reaction with the above prepolymer. Further, since the cured film contains a large number of ethylene units after the reaction because of the four membered ring, it scarcely suffers volume shrinkage and excels in toughness. As a result, there is obtained a cured film which exhibits excellent resistance to cracking. Furthermore, since the reactivity of the polyfunctional oxetane compound is lower than that of the polyfunctional epoxy compound, the photocurable and thermosetting resin composition containing the polyfunctional oxetane compound exhibits longer shelf life (useful life), can be formulated as a one package preparation, and allows formation of a photosensitive dry film excelling in shelf stability at room temperature. The use of such a photocurable and thermosetting resin composition or photosensitive dry film is advantageous in terms of workability. Moreover, another effect of further improving the insulating reliability may also be attained depending on the method for the production of the oxetane compound.

Now, the present invention will be described in detail below. First, as the component (A) mentioned above, any of photosensitive prepolymers (oligomers or polymers) having a carboxyl group in combination with at least two ethylenically unsaturated bonds in its molecule may be used and not limited to particular prepolymers. However, the photosensitive prepolymers as listed below can be particularly advantageously used:

(1) products obtained by the esterification (complete esterification or partial esterification, preferably complete esterification) of an epoxy group of (a) a polyfunctional epoxy compound having at least two epoxy groups in its molecule with a carboxyl group of (b) an unsaturated monocarboxylic acid and the subsequent reaction of (c) a saturated or unsaturated polybasic acid anhydride with the resultant hydroxyl group, (2) products obtained by the reaction of (meth)acrylic acid with a copolymer composed of an alkyl (meth)acrylate and a glycidyl (meth)acrylate and the subsequent reaction of a saturated or unsaturated polybasic acid anhydride (c) with the resultant reaction product, (3) products obtained by the reaction of (meth)acrylic acid with a copolymer composed of a hydroxyalkyl (meth)acrylate, an alkyl (meth)acrylate, and a glycidyl (meth)acrylate and the subsequent reaction of a saturated or unsaturated polybasic acid anhydride (c) with the resultant product, (4) products obtained by the partial reaction of a glycidyl (meth)acrylate with a copolymer composed of an alkyl (meth)acrylate and (meth)acrylic acid, (5) products obtained by causing a saturated or unsaturated polybasic acid anhydride (c) to react with a reaction product (I) of a polyfunctional epoxy compound (a) having at least two epoxy groups in its molecule, an unsaturated monocarboxylic acid (b), and a compound (d) having at least two hydroxyl groups and one other reactive group other than a hydroxyl group capable of reacting with an epoxy group in its molecule, (6) products obtained by causing a hydroxyalkyl (meth) acrylate to react with a copolymer of such an unsaturated polybasic acid anhydride as maleic anhydride with an aromatic hydrocarbon having a vinyl group such as styrene, and (7) unsaturated group-containing polyurethane carboxylate resins such as products obtained by reacting the reaction product (I) mentioned above with a saturated or unsaturated polybasic acid anhydride (c) and an unsaturated group-containing monoisocyanate (e).

The term "(meth)acrylic acid" as used in this specification means acrylic acid, methacrylic acid, or a mixture thereof and the term "(meth)acrylate" means acrylate, methacrylate, or a mixture thereof.

Since the photosensitive prepolymer (A) mentioned above has numerous free carboxyl groups added to the side chain of a backbone polymer, the composition containing this photosensitive prepolymer is developable with a dilute aqueous alkaline solution. When the applied coating film of the composition is developed after exposure to light and then postcured, the addition reaction of the oxetanyl groups of an oxetane compound (D) separately added to the composition as a thermosetting component with the free carboxyl groups in the side chain of the photosensitive prepolymer takes place and the coating film is converted into a film excelling in such properties as resistance to heat, resistance to solvent, resistance to acid, adhesiveness, resistance to electroless gold plating, electrical properties, and hardness. The acid value of the photosensitive prepolymer (A) mentioned above, though having an appropriate range thereof varied with the kind of prepolymer, should fall in the range of 30 to 160 mg KOH/g, preferably in the range of 40 to 120 mg KOH/g. Any deviation of the acid value from the aforementioned range is undesirable because the resin will manifest insufficient solubility in an aqueous alkaline solution if the acid value is less than 30 mg KOH/g. Conversely, the acid value exceeding 160 mg KOH/g will give cause to deteriorate the various properties of the cured film such as resistance to alkalis and electrical properties expected of a resist.

The resin (1) mentioned above is obtained by causing the product of the reaction of such a polyfunctional epoxy compound as will be specifically described hereinafter with an unsaturated monocarboxylic acid to react with such a dibasic acid anhydride as phthalic anhydride or such an aromatic polycarboxylic anhydride as trimellitic anhydride or pyromellitic anhydride. In this case, the resin obtained by the reaction of about 0.15 mol or more of a polybacic acid anhydride with each of the hydroxyl groups possessed by the reaction product of the polyfunctional epoxy compound with an unsaturated monocarboxylic acid proves to be suitable. When the number of ethylenically unsaturated bonds present in one molecule of the resin is small, the produced composition has a low speed of photo-curing. It is therefore desired to use a novolak type epoxy compound as the raw material. A bisphenol A type epoxy resin may be used in combination therewith for the purpose of lowering the viscosity of the composition.

The copolymers which are base polymers of the resins (2) and (3) mentioned above are obtained by using as monomers such alkyl (meth)acrylates and glycidyl (meth)acrylates or further hydroxyalkyl (meth)acrylates as mentioned above and copolymerizing these monomers by any of the well-known methods such as, for example, the method of solution polymerization. The alkyl (meth)acrylates mentioned above are alkyl esters of acrylic acid or methacrylic acid. The alkyl group of the alkyl esters is an aliphatic hydrocarbon group having 1 to 6 carbon atoms. As alkyl (meth)acrylates, esters of acrylic acid or methacrylic acid with methyl, ethyl, propyl, isopropyl, butyl, hexyl, etc. may be cited. It should be noted, however, that these are not exclusive examples.

The hydroxyalkyl (meth)acrylates mentioned above are hydroxyalkyl esters of acrylic acid or methacrylic acid. The hydroxyalkyl group of these hydroxyalkyl esters is desired to be an aliphatic hydrocarbon group having 1 to 6 carbon atoms and containing a primary hydroxyl group. The reason for this desirability is that it is desirable to select and use a hydroxyalkyl (meth)acrylate containing a primary hydroxyl group as one of the component monomers of the aforementioned copolymer from the viewpoint of the ease with which the product of the reaction of the copolymer with (meth) acrylic acid is caused to react further with a polybasic acid anhydride. As typical examples of such hydroxyalkyl (meth) acrylates containing a primary hydroxyl group, 2-hydoxyethyl acrylate, 2-hydroxyethyl methacrylate, etc. may be cited. It should be noted, however, that these are not exclusive examples.

In the copolymer as the basis of the resin (2) mentioned above, the molar ratio of an alkyl (meth)acrylate to glycidyl (meth)acrylate is desired to be in the approximate range of 40:60 to 80:20. On the other hand, in the copolymer as the basis of the resin (3) mentioned above, the molar ratio of a hydroxyalkyl (meth)acrylate to an alkyl (meth)acrylate to glycidyl (meth)acrylate is desired to be in the approximate range of 10–50:10–70:20–60, preferably in the range of 15–30:30–50:30–50. If the proportion of glycidyl (meth) acrylate to the copolymer is unduly low from the lower limit of the range mentioned above, the copolymer will be at a disadvantage in acquiring an unduly low photo-curing properties. Conversely, if this proportion exceeds the upper limit of the range mentioned above, the copolymer will be at a disadvantage in failing to allow the reaction of synthesis of a photosensitive resin to proceed smoothly.

In the resins (2) to (4) mentioned above, the degree of polymerization of the copolymer obtained by copolymerizing the component monomers, as expressed by weight-average molecular weight, is desired to be in the approximate range of 5,000 to 70,000, preferably in the range of 10,000 to 60,000. If the weight-average molecular weight is less than 5,000, the coating film containing the resin will be at a disadvantage in acquiring unduly low dryness to the touch of finger. Conversely, if it exceeds 70,000, the coating film will be at a disadvantage in acquiring an unduly low developing property. Further, such vinyl compounds as styrene and methylstyrene may be used in a proportion not so large as to adversely affect the characteristic properties of the composition in addition to the component monomers mentioned above.

The reaction for the synthesis of the resin (5) mentioned above is attained by the first method which comprises causing an unsaturated monocarboxylic acid (b) [or a compound (d)] to react with a polyfunctional epoxy compound (a) and then causing a compound (d) [or an unsaturated monocarboxylic acid (b)] to react with the resultant reaction product or by the second method which comprises causing simultaneous reaction of a polyfunctional epoxy compound (a), an unsaturated monocarboxylic acid (b), and a compound (d). Though these two methods are both available, the second method proves more advantageous.

Appropriately, the reaction mentioned above is accomplished between one equivalent weight of the epoxy group of the polyfunctional epoxy compound (a) and a total of about 0.8 to 1.3 mols, more preferably about 0.9 to 1.1 mols, of the unsaturated monocarboxylic acid (b) and the compound (d). Properly, the ratio of the amounts of the unsaturated monocarboxylic acid (b) and the compound (d) to be used is such that the amount of the compound (d) to be used may fall in the approximate range of 0.05 to 0.5 mol, more preferably 0.1 to 0.3 mol, based on 1 mol of the total of the amounts of the unsaturated monocarboxylic acid (b) and the compound (d).

In the reaction for the synthesis of the resin (5) mentioned above, it is appropriate to use a diluent, for example, such organic solvents as will be cited hereinbelow and such reactive monomers as carbitol (meth)acrylate, phenoxyethyl (meth)acrylate, pentaerythritol tetra(meth)acrylate, trimethylolpropane tri(meth)acrylate, tris(hydroxyethyl) isocyanurate tri(meth)acrylate, and dipentaerythritol hexa(meth) acrylate. Further, for promoting the reaction, it is appropriate to use a catalyst such as, for example, triethyl amine, benzyl dimethyl amine, methyl triethyl ammonium chloride, benzyl trimethyl ammonium bromide, benzyl trimethyl ammonium iodide, triphenyl phosphine, triphenyl stibine, chromium octanoate, and zirconium octanoate. Appropriately, the amount of the catalyst to be used is in the approximate range of 0.1 to 10% by weight, based on the total amount of the mixture of reactants. For preventing the reaction from entraining polymerization, it is proper to use a polymerization inhibitor such as, for example, hydroquinone, methyl hydroquinone, hydroquinone monomethyl ether, catechol, and pyrogallol. The amount of the polymerization inhibitor to be used appropriately is in the approximate range of 0.01 to 1% by weight, based on the amount of the mixture of reactants. Properly, the reaction temperature is in the approximate range of 60 to 150° C. and the reaction time in the approximate range of 5 to 60 hours. Thus, the reaction product (I) can be obtained.

Next, the reaction of the reaction product (I) mentioned above and the polybasic acid anhydride (c) is appropriately carried out between one equivalent weight of the hydroxyl group in the reaction product (I) and about 0.1 to 0.9 equivalent weight of the polybasic acid anhydride (c). Appropriately, the reaction temperature is in the approximate range of 60 to 150° C. and the reaction time in the approximate range of 1 to 10 hours.

The synthesis reaction of the unsaturated group-containing polyurethane carboxylate resin (7) mentioned above is appropriately effected by causing the reaction product (I) mentioned above to react with the polybasic acid anhydride (c) and then causing the unsaturated group-containing monoisocyanate (e) to react with the resultant reaction product. The reaction of the reaction product (I) with the polybasic acid anhydride (c) can be effected as described above. Appropriately, this reaction is followed by the reaction between one equivalent weight of the hydroxyl group in the unsaturated group-containing polycarboxylic acid resin resulting from the reaction of the reaction product (I) with the polybasic acid anhydride (c) and about 0.05 to 0.5 equivalent weight of the unsaturated group-containing monoisocyanate (e). The reaction temperature appropriately is in the approximate range of 60 to 100° C. Properly this reaction proceeds in the presence of a small amount of a catalyst (such as, for example, dibutyl tin laurate). The preferred reaction time is in the approximate range of 5 to 15 hours.

As concrete examples of the epoxy compound (a) having at least two epoxy groups in its molecule and used for the syntheses of the resins (1), (5), and (7) mentioned above, for example, novolak type epoxy resins (such as, for example, those which are obtained by causing such phenols as phenol, cresol, halogenated phenols, and alkyl phenols to react with formaldehyde in the presence of an acidic catalyst and then causing the resultant novolaks to react with epichlorohydrin and/or methyl epichlorohydrin and which include such commercially available substances as EOCN-103, EOCN-104S, EOCN-1020, EOCN-1027, EPPN-201, and BREN-S produced by Nippon Kayaku Co., Ltd., DEN-431 and DEN-439 produced by The Dow Chemical Company, N-730, N-770, N-865, N-665, N-673, N-695, and VH-4150 produced by Dainippon Ink and Chemicals, Inc.), bisphenol type epoxy resins (such as, for example, those which are obtained by causing such bisphenols as bisphenol A, bisphenol F, bisphenol S, and tetrabromobisphenol A to react with epichlorohydrin and/or methyl epichlorohydrin or by causing epichlorohydrin and/or methyl epichlorohydrin to react with condensates of diglycidyl ether of bisphenol A with the bisphenols mentioned above and which include such commercially available substances as EPIKOTE 1004 and EPIKOTE 1002 produced by Japan Epoxy Resin K.K. and DER-330 and DER-337 produced by The Dow Chemical Company), trisphenol methane type epoxy resins (such as, for example, those which are obtained by causing trisphenol methane or triscresol methane to react with epichlorohydrin and/or methyl epichlorohydrin and which include such commercially available substances as EPPN-501 and EPPN-502 produced by Nippon Kayaku Co., Ltd.), tris(2,3-epoxypropyl) isocyanurate, biphenyl diglycidyl ether, alicyclic or amino group-containing epoxy resins (such as, for example, Celloxide 2021 produced by Daicel Chemical Industries, Ltd., Epomic VG-3101 produced by Mitsui Petrochemical Industries, Ltd., E-1031S produced by Japan Epoxy Resin K.K., TETRAD-X andT ETRAD-C produced by Mitsubishi Gas Kagaku K.K., and EPB-13 and EPB-27 produced by Nippon Soda Co., Ltd.), copolymer type epoxy resins (such as, for example, copolymer of glycidyl methacrylate with styrene and copolymers of glycidyl methacrylate with styrene and methyl methacrylate, which include CP-50M and CP-50S produced by Nippon Oils & Fats Co., Ltd., and copolymers of glycidyl methacrylate with cyclohexyl maleimide), cardo type epoxy resins (for example, such a commercially available product as ESF-300 produced by Shin-Nittetsu Kagaku K.K.), calixarene type epoxy resins, and other epoxy resins having special structures may be cited. Among other epoxy resins mentioned above, cresol novolak type epoxy resins, phenol novolak type epoxy resins, and cardo type epoxy resins having a fluorene skeleton, etc. prove to be particularly advantageous.

As concrete examples of the unsaturated monocarboxylic acids (b) used for the synthesis of the aforementioned resins (1), (5), and (7), for example, acrylic acid, dimer of acrylic acid, methacrylic acid, β-styrylacrylic acid, β-furfuryl acrylic acid, crotonic acid, α-cyanocinnamic acid, cinnamic acid; half esters obtained by the reaction of a saturated or unsaturated dibasic acid anhydride with a (meth)acrylate having one hydroxyl group per molecule or by the reaction of a saturated or unsaturated dibasic acid anhydride with an unsaturated monoglycidyl compound, such as, for example, half esters obtained by causing a saturated or unsaturated dibasic acid anhydride such as succinic anhydride, maleic anhydride, phthalic anhydride, tetrahydrophtalic anhydride, hexahydrophthalic anhydride, methylhexahydrophthalic anhydride, methyltetrahydrophthalic anhydride, itaconic anhydride, and methylendomethylene tetrahydrophthalic anhydride, to react in an equimolar ratio with a (meth)

acrylate having one hydroxyl group per molecule such as hydroxyethyl (meth)acrylate, hydroxypropyl (meth) acrylate, hydroxybutyl (meth)acrylate, polyethylene glycol mono(meth)acrylate, glycerin di(meth)acrylate, trimethylol propane di(meth)acrylate, pentaerythritol tri(meth)acrylte, dipentaerythritol penta(meth)acrylate, and (meth)acrylate of phenyl glycidyl ether and half esters obtained by causing a saturated or unsaturated dibasic acid (such as, for example, succinic acid, maleic acid, adipic acid, phthalic acid, tetrahydrophthalic acid, itaconic acid, and fumaric acid) to react in an equimolar ratio with an unsaturated monoglycidyl compound (such as, for example, glycidyl (meth) acrylate and the compounds represented by the following formulae (1) to (4) may be cited. These unsaturated monocarboxylic acids may be used either singly or in the form of a combination of two or more members. Among other monocarboxylic acids cited above, acrylic acid and methacrylic acid, particularly acrylic acid, prove to be particularly desirable from the viewpoint of the photo-curing properties.

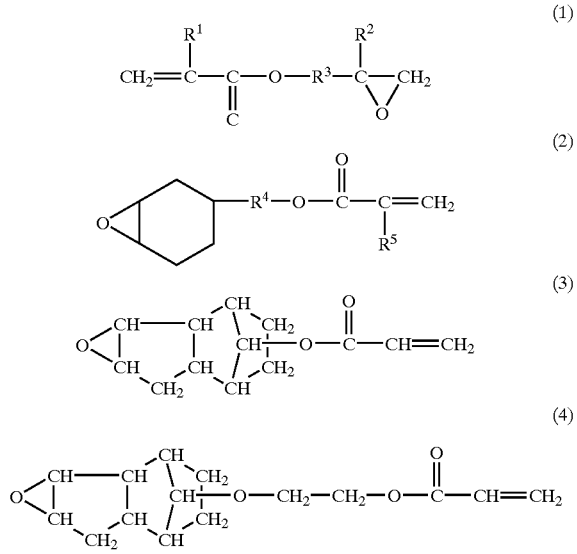

wherein, $R^1$, $R^2$, and $R^5$ independently represent a hydrogen atom or a methyl group, $R^3$ represents an aliphatic hydrocarbon of 1 to 12 carbon atoms, and $R^4$ represents

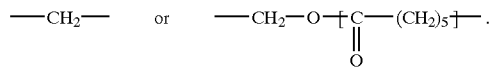

As typical examples of the saturated or unsaturated polybasic acid anhydrides (c) used for the synthesis of the aforementioned resins (1) to (3) and (5) to (7), dibasic acid anhydrides such as maleic anhydride, succinic anhydride, itaconic anhydride, phthalic anhydride, tetrahydrophthalic anhydride, hexahydrophthalic anhydride, methylhexahydrophthalic anhydride, endomethylenetetrahydrophthalic anhydride, methylendomethylenetetrahydrophthalic anhydride, chlorendic anhydride, and methyltetrahydrophthalic anhydride; aromatic polycarboxylic anhydrides such as trimellitic anhydride, pyromellitic anhydride, and benzophenone-tetracarboxylic dianhydride; and polycarboxylic anhydride derivatives thereof such as 5-(2,5-dioxotetrahydrofuryl)-3-methyl-3-cyclohexene-1,2-dicarboxylic anhydride may be used. Among other polybasic acid anhydrides cited above, tetrahydrophthalic anhydride and hexahydrophthalic anhydride prove to be particularly desirable.

Then, as concrete examples of the compound (d) having at least two hydroxyl groups and one reactive group (such as, for example, carboxyl group or secondary amino group) other than the hydroxyl group capable of reacting with an epoxy group in its molecule used for the syntheses of the resins (5) and (7) mentioned above, for example, polyhydroxy-containing monocarboxylic acids such as dimethylol propionic acid, dimethylol acetic acid, dimethylol butyric acid, dimethylol valeric acid, and dimethylol caproic acid; and dialkanol amines such as diethanol amine and diisopropanol amine may be cited. As the particularly desirable compound, dimethylol propionic acid etc., for example, may be cited.

As concrete examples of the unsaturated monoisocyanate (e) mentioned above, for example, methacryloyl isocyanate, methacryloyl oxyethyl isocyanate, and the reaction products resulting from the reaction of organic diisocyanates (such as, for example, tolylene diisocyanate, xylylene diisocyanate, isophorone diisocyanate, and hexamethylene diisocyanate) with (meth)acrylates having one hydroxyl group in its molecule mentioned above at a substantially equimolar ratio may be cited.

As a polymerization initiator of the component (B), a photo-radical polymerization initiator and/or heat radical polymerization initiator which generates radicals by irradiation of an actinic energy ray or by heating may be used.

As the photo-radical polymerization initiator to be used as the polymerization initiator (B), any known compounds which generate radicals by irradiation of an actinic energy ray may be used. As concrete examples thereof, acetophenones such as acetophenone, 2,2-dimethoxy-2-phenyl acetophenone, 2,2-diethoxy-2-phenyl acetophenone, p-dimethylaminopropiophenone, dichloroacetophenone, trichloroacetophenone, p-tert-butyl trichloroacetophenone, 1-hydroxycyclohexyl phenyl ketone, 2-methyl-1-[4-(methylthio)phenyl]-2-morpholino-propan-1-one, 2-benzyl-2-dimethylamino-1-(4-morpholinophenyl)-butanone-1, and N,N-dimethyl-aminoacetophenone; benzophenones such as benzophenone, methylbenzophenone, 2-chlorobenzophenone, 4,4'-dichlorobenzophenone, 4,4'-bis(dimethylamino)benzophenone, 4,4'-bis(diethylamino) benzophenone, Michler's ketone, and 4-benzoyl-4'-methyldiphenyl sulfide; benzil, benzoin, and benzoin ethers such as benzoin methyl ether, benzoin ethyl ether, benzoin isopropyl ether, and benzoin isobutyl ether; ketals such as acetophenone dimethyl ketal and benzyl dimethyl ketal; thioxanthones such as thioxanthone, 2-chlorothioxanthone, 2,4-dimethylthioxanthone, 2,4-diethylthioxanthone, and 2,4-diisopropylthioxanthone; anthraquinones such as 2-methyl-anthraquinone, 2-ethyl-anthraquinone, 2-tert-butyl-anthraquinone, 1-chloroanthraquinone, 2-amino-anthraquinone, and 2,3-diphenyl-anthraquinone; organic peroxides such as benzoyl peroxide and cumene peroxide; thiol compounds such as dimer of 2,4,5-triaryl imidazole, riboflavin tetrabutylate, 2-mercaptobenzimidazole, 2-mercaptobenzoxazole, and2-mercaptobenzothiazole; organic halogen compounds such as 2,4,6-tris-S-triazine, 2,2,2-tribromoethanol, and tribromomethyl phenyl sulfone; and 2,4,6-trimethylbenzoyl diphenyl phosphine oxide may be cited. These compounds may be used either singly or in the form of a combination of two or more members. Optionally, the photo-radical polymerization initiator may be used in combination with one member or a mixture of two or more members selected from the photosensitizers such as tertiary amines like N,N-(dimethylamino)ethylbenzoate, N,N-(dimethylamino)isoamyl benzoate, penthyl-4-dimethylaminobenzoate, triethyl amine, and triethanol amine, thioethers such as β-thiodiglycol; sensitizing dyestuff such as (keto) cumalin and thioxantene, and alkyl borates of such dyestuff as cyanine, rhodamine, safranine, malachite green, and methylene blue.

The preferred combinations of the photo-radical polymerization initiators include the combinations of 2-methyl-1-[4-(methylthio)-phenyl]-2-morphorino-propan-1-one (such as, for example, Irgacure 907 produced by Ciba Specialty Chemicals Ltd.) with 2-chlorothioxanthone (such as, for example, Kayacure-CTX produced by Nippon Kayaku Co., Ltd.), 2,4-diethylthioxanthone (such as, for example, Kayacure-DETX produced by Nippon Kayaku Co., Ltd.), 2-isopropylthioxanthone, or 4-benzoyl-4'-methyldiphenyl sulfide, for example. The amount of the aforementioned photo-radical polymerization initiator to be used suitably falls in the range of 0.2 to 30 parts by weight, preferably 2 to 10 parts by weight, based on 100 parts by weight of the aforementioned photosensitive prepolymer (A). If the amount of the photo-radical polymerization initiator to be used is less than 0.2 part by weight, the composition will suffer from inferior photo-curing properties. Conversely, if the amount exceeds 30 parts by weight, the composition will entail the disadvantage of exhibiting inferior quality for cured film and poor stability during storage.

As the heat radical polymerization initiators which are usable in the present invention, organic peroxides such as benzoyl peroxide, acetyl peroxide, methyl ethyl ketone peroxide, lauroyl peroxide, dicumyl peroxide, di-t-butyl peroxide, t-butyl hydroperoxide, and cumene hydroperoxide; and azo type initiators such as 2,2'-azobisisobutyronitrile, 2,2'-azobis-2-methylbutyronitrile, 2,2'-azobis-2,4-divaleronitrile, 1,1'-azobis(1-acetoxy-1-phenylethane), 1'-azobis-1-cyclohexane carbonitrile, dimethyl-2,2'-azobisisobutylate, 4,4'-azobis-4-cyanovalic acid, and 2-methyl-2,2'-azobispropanenitrile may be cited. As the preferred initiator, 1,1'-azobis(1-acetoxy-1-phenylethane) of the non-cyane and non-halogen type is cited. The heat radical polymerization initiator is used in the range of 0.1 to 10 parts by weight, preferably 0.5 to 5 parts by weight, based on 100 parts by weight of the photosensitive prepolymer (A) mentioned above.

When an organic peroxide which exhibits a lower curing rate is used as the heat radical polymerization initiator, tertiary amines such as tributylamine, triethylamine, dimethyl-p-toluidine, dimethylaniline, triethanolamine, and diethanolamine, or metallic soap such as cobalt naphthenate, cobalt octoate, and manganous naphthenate may be used as a promotor.

As the diluent of the component (C) mentioned above, an organic solvent and/or a photopolymerizable monomer may be used. As the organic solvents, ketones such as methyl ethyl ketone and cyclohexanone; aromatic hydrocarbons such as toluene, xylene, and tetramethyl benzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and triethylene glycol monoethyl ether; acetates such as ethyl acetate, butyl acetate, cellosolve acetate, butyl cellosolve acetate, carbitol acetate, butyl carbitol acetate, propylene glycol monomethylether acetate, and dipropylene glycol monomethyl ether acetate; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha may be cited. These organic solvents may be used either singly or in the form of a combination of two or more members.

The organic solvent is used for the purpose of dissolving the photosensitive prepolymer (A) mentioned above, diluting the composition, allowing the composition to be applied to a substrate in the from of a liquid, enabling the applied layer of the composition to form a film by the predrying, and allowing the film to be exposed to light by the scontact exposure, or for the purpose of allowing the composition to be applied to a supporting film and enabling the applied layer of the composition to form a film by the predrying to prepare a photosensitive dry film. Though the amount of the organic solvent to be used is not particularly restricted, it is properly in the approximate range of 30 to 300 parts by weight, based on 100 parts by weight of the photosensitive prepolymer (A) mentioned above. The amount of the organic solvent may be suitably set so as to fit the method of application to be selected.

As typical examples of the photopolymerizable monomers, 2-hydroxyethyl acrylate, 2-hydroxypropyl acrylate, N-vinylpyrrolidone, acryloyl morpholine, methoxytetraethylene glycol acrylate, methoxypolyethylene glycol acrylate, polyethylene glycol diacrylate, N,N-dimethyl acrylamide, N-methylol acrylamide, N,N-dimethylaminopropyl acrylamide, N,N-dimethylaminoethyl acrylate, N,N-dimethylaminopropyl acrylate, melamine acrylate, diethylene glycol diacrylate, triethylene glycol diacrylate, propylene glycol diacrylate, dipropylene glycol diacrylate, tripropylene glycol diacrylate, polypropylene glycol diacrylate, phenoxyethyl acrylate, tetrahydrofurfuryl acrylate, cyclohexyl acrylate, glycerin diglycidyl ether diacrylate, glycerin triglycidyl ether triacrylate, isobornyl acrylate, cyclopentadiene mono- or di-acrylate; polyfunctional acrylates of polyhydric alcohols such as hexane diol, trimethylol propane, pentaerythritol, ditrimethylol propane, dipentaerythritol, and tris-hydroxyethyl isocyanurate and of ethylene oxide or propylene oxide adducts thereof; methacrylates corresponding to the acrylates enumerated above; and mono-, di-, tri-, and higher polyesters of polybasic acids with hydroxyalkyl (meth)acrylates may be cited. These monomers may be used either singly or in the form of a combination of two or more members.

The aforementioned photopolymerizable monomer is used for the purpose of diluting the aforementioned photosenstive prepolymer thereby rendering the produced composition easily applicable, and imparting photopolymerizability upon the composition. The preferred amount of the monomer to be used is in the range of 3 to 50 parts by weight, based on 100 parts by weight of the photosensitive prepolymer (A) mentioned above. If the amount of the monomer is less than 3 parts by weight, the composition will be at a disadvantage in failing to enhance the photo-curing properties. Conversely, if the amount exceeds 50 parts by weight, the composition will be at a disadvantage in failing to heighten dryness of the film to the tack-free touch of finger.

The photocurable and thermosetting resin composition of the present invention, besides the components described above, contains further an oxetane compound (D) having at least two oxetanyl groups in its molecule as a thermosetting component. As a result, this composition can be advantageously used for the formation of various resinous insulating layers, for the use as an etching resist and a marking ink, and for the formation of a solder resist on printed circuit boards.

As typical examples of the compound containing two oxetane rings in its molecule, bisoxetanes represented by the following general formula (5) may be cited.

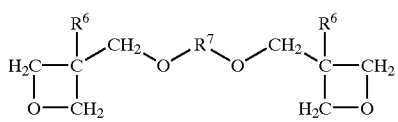
(5)

In the general formula (5) mentioned above, $R^6$ represents a hydrogen atom or an alkyl group of 1 to 6 carbon atoms, and $R^7$ represents a bivalent group selected from among linear or branched saturated hydrocarbons of 1 to 12 carbon atoms, linear or branched unsaturated hydrocarbons of 1 to 12 carbon atoms, aromatic hydrocarbons represented by the following formulas (A), (B), (C), (D), and (E), linear or cyclic alkylene groups containing a carbonyl group and represented by the following formulas (F) and (G), and aromatic hydrocarbons containing a carbonyl group and represented by the following formulas (H) and (I).

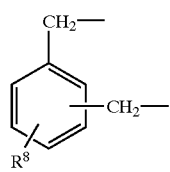
(A)

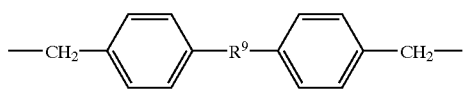
(B)

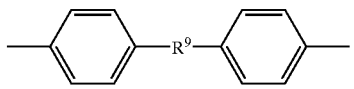
(C)

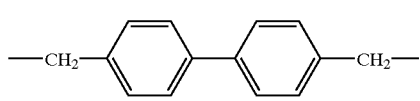
(D)

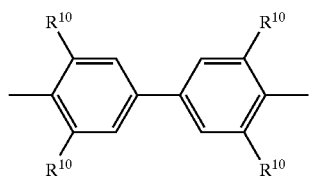
(E)

wherein $R^8$ represents a hydrogen atom, an alkyl group of 1 to 12 carbon atoms, an aryl group, or an aralkyl group, $R^9$ represents —O—, —S—, —CH$_2$—, —NH—, —SO$_2$—, —CH(CH$_3$)—, —C(CH$_3$)$_2$—, or —C(CF$_3$)$_2$—, and $R^{10}$ represents a hydrogen atom or an alkyl group of 1 to 6 carbon atoms.

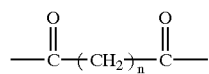
(F)

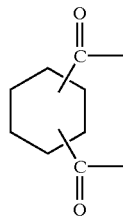
(G)

wherein n represents an integer of 1 to 12.

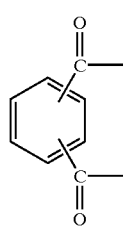
(H)

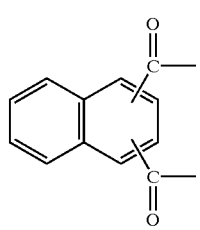
(I)

As typical examples of the compound containing three or more oxetane rings in its molecule, etherified products of an oxetane with a hydroxyl group-containing resin such as a novolak resin, poly(p-hydroxy styrene), cardo type oxetane resin, calixarenes, or a silicone resin like a cylseski oxane besides a compound represented by the following general formula (6) may be cited. In addition thereto, a copolymer of an unsaturated monomer containing an oxetane ring and an alkyl (meth)acrylate may be cited.

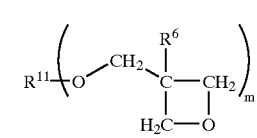
(6)

In the general formula (6) mentioned above, $R^6$ represents the same meaning as mentioned above, $R^{11}$ represents a residue of the hydroxyl group-containing resin of the etherified product mentioned above, a branched alkylene group of 1 to 12 carbon atoms represented by the following formula (J), (K) or (L), or an aromatic hydrocarbon represented by the following formula (M), (N) or (P), and m represents the number of functional groups bonded to the residue $R^{11}$, an integer of three or more, preferably an integer of 3 to 5,000.

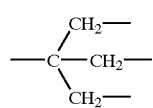
(J)

-continued

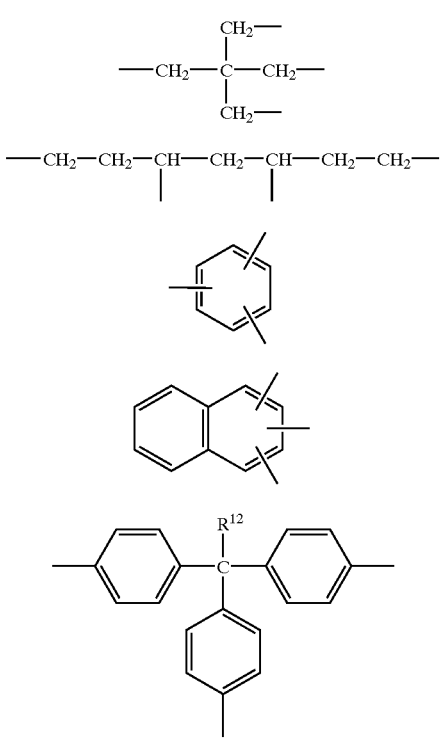

wherein $R^{12}$ represents a hydrogen atom, an alkyl group of 1 to 6 carbon atoms, or an aryl group.

The polyfunctional oxetane compounds (D) may be used either singly or in the form of a combination of two or more members. Among other oxetane compounds cited above, the finely pulverized oxetane resins which exhibit sparing solubility in a diluent to be used or a combination of the sparingly soluble oxetane resin and the soluble oxetane resin prove to be particularly desirable. The amount of the polyfunctional oxetane compound (D) mentioned above to be incorporated in the composition as a thermosetting component is desired to be in the range of 5 to 100 parts by weight, preferably 15 to 60 parts by weight, based on 100 parts by weight of the photosensitive prepolymer (A) mentioned above.

As a curing promotor (E), any compound may be arbitrarily selected from among tertiary amines, tertiary amine salts, quaternary onium salts, tertiary phosphines, imidazole derivatives, and crown ether complex (such as, for example, 18-crown-6/potassium phenoxide, potassium benzoether, KCl, KBr or ammonium acetate). These compounds may be used either singly or in the form of a combination of two or more members. Besides, a phosphonium ylide etc. may be used.

As the tertiary amine, triethylamine, tributylamine, DBU (1,8-diazabicyclo[5.4.0]undeca-7-ene), DBN (1,5-diazabicyclo[4.3.0]nona-5-ene), DABCO (1,4-diazabicyclo[2.2.2]octane), pyridine, N,N-dimethyl-4-amino pyridine, etc. may be cited.

As the tertiaryamine salt, U-CAT series of Sun-Apro K.K., for example, may be cited.

Further, a quaternary onium salt obtained by the addition reaction of a tertiary amine or a tertiary phosphine with a carboxylic acid or a highly acidic phenol may be used as the reaction promotor. They may be in the form of a quaternary salt before adding to the reaction system. Alternatively, they may be individually added to the reaction system so as to form the quaternary salt in the reaction system. As the concrete examples thereof, tributylamine acetic acid salt obtained from tributylamine and acetic acid and triphenylphosphine acetic acid salt formed from triphenylphosphine and acetic acid may be cited.

As the quaternary onium salt, ammonium salts, phosphonium salts, arsonium salts, stibonium salts, oxonium salts, sulfonium salts, selenonium salts, stannonium salts, iodonium salts, etc. may be cited. Particularly preferable salts are quaternary ammonium salts and quaternary phosphonium salts. As concrete examples of the quaternary ammonium salts, tetra-n-butylammonium chloride (TBAC), tetra-n-butylammonium bromide (TBAB), tetra-n-butylammonium iodide (TBAI), and tetra-n-butylammonium acetate (TBAAc) may be cited. As concrete examples of the quaternary phosphonium salts, tetra-n-butylphosphonium chloride (TBPC), tetra-n-butylphosphonium bromide (TBPB), tetra-n-butylphosphonium iodide (TBBI), tetraphenylphosphonium chloride (TPPC), tetraphenylphosphonium bromide (TPPB), tetraphenylphosphonium iodide (TPPI), ethyltriphenylphosphonium bromide (ETPPB), ethyltriphenylphosphonium acetate (ETPPAc), etc. may be cited.

As the tertiary phosphine, any trivalent organic phosphorus compounds containing an alkyl group of 1 to 12 carbon atoms or an aryl group may be used. As the concrete examples thereof, triethylphosphine, tributylphosphine, triphenylphosphine, etc. may be cited.

As the imidazole derivatives, imidazole, 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole, etc. may be cited. The compounds which are commercially available include products of Shikoku Chemicals Co., Ltd., 2MZ-A, 2MZ-OK, 2PHZ, 2P4BHZ, and 2P4MHZ. As the compounds which can improve the stability with time, the products of Asahi-Ciba Co., Ltd., Novacure HX-3721, HX-3748, HX-3741, HX-3088, HX-3722, HX-3742, HX-3921HP, HX-3941HP, HX-3613, etc. may be cited.

Although any known compounds obtained by the reaction of a phosphonium salt and a base may be used as the phosphonium ylide, a highly stable compound is preferable from the viewpoint of easy handling. As concrete examples thereof, (formylmethylene)triphenylphosphine, (acetylmethylene)triphenylphosphine, (pivaloylmethylene) triphenylphosphine, (benzoylmethylene) triphenylphosphine, (p-methoxybenzoylmethylene) triphenylphosphine, (p-methylbenzoylmethylene) triphenylphosphine, (p-nitrobenzoylmethylene) triphenylphosphine, (naphthoyl)triphenylphosphine, (methoxycarbonyl)triphenylphosphine, (diacetylmethylene) triphenylphosphine, (acetylcyano)triphenylphosphine, (dicyanomethylene)triphenylphosphine, etc. may be cited.

The amount of the curing promotor (E) to be used is preferred to be in the approximate range of 0.1 to 25 mol %, more preferably 0.5 to 20 mol %, most preferably 1 to 15 mol %, based on one mol of the oxetanyl group. If the amount of the curing promotor to be used is less than 0.1 mol % of the oxetanyl group, the reaction will not proceed at a practical reaction speed. Conversely, a large amount exceeding 25 mol % is not desirable from the economical viewpoint because a remarkable reaction promotion effect will not be obtained even when the promotor is present in such a large amount.

As described above, since the reactivity of the polyfunctional oxetane compound is lower than that of the polyfunctional epoxy compound, the photocurable and thermosetting resin composition containing the polyfunctional oxetane compound exhibits longer shelf life (useful life), can be formulated as a one package preparation, and allows formation of a photosensitive dry film which can be stored at room temperature. However, when it takes relatively much time from the preparation of the composition to the beginning of use thereof or to the application to a supporting film, since the composition containing the thermosetting component added thereto in advance is liable to gain in viscosity prior to being applied to a blank circuit board or to a supporting film, it is proper to have them mixed immediately prior to use. To be specific, it is appropriate to prepare two separate solutions, i.e. a hardener solution comprising the aforementioned polyfunctional oxetane compound (D) as a main component and a main agent solution comprising the aforementioned photosensitive prepolymer (A) as a main component and the curing promotor (E) etc. added thereto and, and mix these solutions prior to use. The aforementioned photopolymerizable monomers, fillers, coloring pigments, etc. may be mixed into a solvent solution of the polyfunctional oxetane compound (D) as the thermosetting component.

In the photocurable and thermosetting resin composition of the present invention, an epoxy compound may be mixed as part of the thermosetting component in a proportion not so large as to adversely affect the effects of the use of the polyfunctional oxetane compound as the thermosetting component. As the epoxy compound mentioned above, any compound my be used insofar as it has at least two epoxy groups in its molecule. As the examples of the epoxy compound, various well-known and popularly adopted epoxy compounds such as, for example, glycidyl ether compounds such as bisphenol A epoxy resin, bisphenol F epoxy resin, bisphenol S epoxy resin, brominated bisphenol A epoxy resin, hydrogenated bisphenol A epoxy resin, biphenol epoxy resin, bixylenol epoxy resin, alicyclic epoxy resin, phenol novolak epoxy resin, cresol novolak epoxy resin, brominated phenol novolak epoxy resin, and novolak epoxy resin of bisphenol A; glycidyl ester compounds such as terephthalic diglycidyl ester, hexahydrophthalic diglycidyl ester, and dimeric diglycidyl ester; and glycidyl amine compounds such as triglycidyl isocyanurate, N,N,N',N'-tetraglycidyl methaxylene diamine, N,N,N',N'-tetraglycidyl bis(aminomethyl)-cyclohexane, and N,N-diglycidyl aniline may be used. These epoxy compounds may be used either singly or in the form of a combination of two or more members. Although any epoxy compounds which exhibit sparing solubility or solubility in a diluent (C) to be used may be used as the epoxy compound, the finely pulverized epoxy compound which exhibits sparing solubility in a diluent and is in the state of solid or semi-solid at room temperature or a combination of this sparingly soluble epoxy compound and the soluble epoxy compound prove to be particularly desirable from the viewpoint of developability etc.

Further, for the purpose of promoting the thermal curing reaction, a small amount of a well-known epoxy curing promotor such as quaternary ammonium salts, quaternary phosphonium salts, tertiary amines, imidazoles, and dicyandiamide may be used in combination therewith.

The composition of the present invention may incorporate therein, as desired, a well-known and widely used inorganic filler such as barium sulfate, barium titanate, silicon dioxide power, amorphous silica, talc, magnesium carbonate, calcium carbonate, aluminum oxide, aluminum hydroxide, glass fiber, carbon fiber, and mica power for the purpose of enhancing the characteristics of the composition such as adhesion and hardness. The amount of the inorganic filler to be used is in the range of 0 to 60% by weight, preferably 5 to 40% by weight of the composition. Further, the composition may incorporate therein, as desired, a well-known and widely used additive such as a coloring pigment represented by phthalocyanine blue, phthalocyanine green, Iodine Green, disazo yellow, crystal violet, titanium dioxide, carbon black, and naphthalene black; a thermopolymerization inhibitor represented by hydroquinone, hydroquinone monomethyl ether, t-butyl catechol, pyrogallol, and phenothiazine; a thickening agent represented by asbestos and finely powdered silica; an anti-foaming agent and/or leveling agent represented by silicone type, fluorine type, or macromolecular type; and an adhesiveness-imparting agent represented by imidazole type, thiazole type, triazole type, and silane coupling agent.

In the manufacture of a photosensitive dry film of the present invention, the photocurable and thermosetting resin composition of the present invention as mentioned above is adjusted, when necessary, to a level of viscosity suitable for the coating method, applied to a suitable supporting film such as, for example, a flexible base film, and then dried at a temperature in the range of about 60 to 100° C., for example, thereby to evaporate the organic solvent from the composition and give rise to a photosensitive dry film which has a tack-free photocurable and thermosetting dry film layer. It is preferred to preserve the photocurable and thermosetting dry film layer until use thereof in such a state that the dry film layer formed on the supporting film is protected by a protective film laminated thereon.

As the supporting film, various synthetic resin films made of, for example, polyethylene terephthalate (PET), polyethylene (PE), polypropylene, polycarbonate, polyether sulfone, or polyvinyl chloride may be used. The proper thickness of this supporting film is in the range of 15 to 125 μm.

For the formation of a coating film, various coating methods using an applicator, a bar coater, a roll coater, a die coater, a curtain flow coater, etc. or the screen printing method and the like may be adopted. The proper thickness of the coating film is in the range of 10 to 150 μm as the thickness after drying.

The protective film to be laminated on the dry film layer is used for stably protecting the dry film at the time of not putting to use and removed at the time of use. Therefore, it should have such proper release characteristics that it is not peeled off at the time of not putting to use, but it can be easily separated from the dry film layer at the time of use. As the protective film which fulfills such requirements, a PET film, a polypropylene film, a PE film, etc. may be used. Further, the above-mentioned film further coated with silicone or baked may be used. This protective film is preferred to have a thickness in the range of about 15 to 100 μm.

Moreover, for the purpose of preventing the photocurable and thermosetting resin composition from suffering the sensitivity reduction owing to oxygen and adhesion of the photo-mask for pattern formation to be tightly laminated thereon at the time of exposure, it is possible to further form a layer of a water-soluble resin composition on the dry film layer. In the case of such a photosensitive dry film, it is preserved by laminating the protective film on the layer of the water-soluble resin composition. The layer of the water-soluble resin composition is formed by applying an aqueous 5–20 wt. % solution of polyvinyl alcohol or partially saponified polyvinyl acetate to the dry film layer in such a proportion that the thickness may become 1–10 μm as the dry film thickness and drying it.

Incidentally, ethylene glycol, propylene glycol, polyethylene glycol, etc. may also be added to the solution of the water-soluble resin composition. In the preparation of this solution, when taking the viscosity and anti-foaming properties thereof into consideration, a solvent such as, for example, methanol, ethylene glycol monomethyl ether acetate, and acetone or a commercially available water-soluble anti-foaming agent or the like may also be added thereto.

Now, a method of forming a pattern by the use of the photocurable and thermosetting resin composition of the present invention is described hereinbelow. First, the composition is adjusted, when necessary, to a level of viscosity suitable for the coating method, applied by a screen printing method, a curtain coating method, a dip coating method, a spray coating method, a roll coating method, a spin coating method, or the like to a printed circuit board having a circuit already formed thereon, for example, and then predried at a temperature in the approximate range of 60 to 100° C., for example, thereby to evaporate the organic solvent from the composition and give rise to a tack-free coating film. Then, the composition coated on the printed circuit board is selectively exposed to an actinic ray through a photomask having a prescribed pattern by the contact method or non-contact method and the composition in the unexposed areas of the coating film is developed with a dilute aqueous alkaline solution (such as, for example, an aqueous solution of about 0.5 to 5% sodium carbonate) to obtain a resist pattern. Thereafter, the photo-cured coating film is further thermally cured by subjecting to the heat treatment at a temperature in the approximate range of 140 to 200° C., for example. By this thermal treatment, in addition to the curing reaction of the aforementiond thermosetting components, the polymerization of the photocurable resin components is promoted and the copolymerization of this component with the thermosetting component are also facilitated so that the consequently produced resist film acquires improvements in various properties such as resistance to heat, resistance to adhesion of solder, resistance to solvents, resistance to acids, adhesiveness, resistance to electroless gold plating, electric properties, printability, and hardness.

When the composition is also used as a material for the interlaminar insulating layer in a build-up multi-layer printed circuit board, a pattern may be formed in the same manner as mentioned above.

Next, a pattern forming method by the use of the photosensitive dry film of the present invention is explained.

First, when the photosensitive dry film has a protective film, the protective film is separated therefrom. The photosensitive dry film is tightly superposed on a substrate on which a pattern is formed in such a manner that a dry film layer is brought into contact with the substrate, and a supporting film is separated, thereby transferring the dry film layer consisting of the photocurable and thermosetting resin composition to the substrate. As the transferring method, a hot press bonding method which comprises previously heating the substrate to be processed is desirable. A vacuum bonding method which achieves press boding under vacuum may also be adopted. Although the substrate to be processed can be arbitrarily chosen according to the usage of the photosensitive dry film aimed at. When it is used as a solder resist for a printed circuit board, for example, it is transferred to the printed circuit board having circuits previously formed thereon. When it is used as an interlaminar insulating layer for a build-up multi-layer printed circuit board, it is transferred to an inner board.

The dry film layer transferred is exposed to light through a pattern mask and subsequently developed to remove the unexposed areas, thereby forming a pattern.

Thereafter, in the case of the formation of a solder resist, for example, the dry film layer is selectively exposed to an actinic ray through a photomask having a prescribed pattern by a contact exposure method or non-contact exposure method and the unexposed areas of the film is removed by development with a dilute aqueous alkaline solution (such as, for example, an aqueous solution of about 0.5 to 5% sodium carbonate) to form a resist pattern. Then, the film is further thermally cured by subjecting to the heat treatment at a temperature in the range of about 140 to 200° C., for example. By this thermal treatment, in addition to the curing reaction of the aforementiond thermosetting components, the polymerization of the photocurable resin components is promoted and the cross-linking reaction of this component with the thermosetting component are also facilitated so that the consequently produced resist film acquires improvements in various properties such as resistance to heat, resistance to adhesion of solder, resistance to solvents, resistance to acids, adhesiveness, resistance to electroless gold plating, electric properties, printability, and hardness.

As an aqueous alkaline solution to be used in the process of development mentioned above, aqueous alkaline solutions of potassium hydroxide, sodium hydroxide, sodium carbonate, potassium carbonate, sodium phosphate, sodium silicate, ammonia, tetramethylammonium hydroxide, organic amines, etc. can be used.

The light sources which are properly used for the purpose of photo-curing the composition include a low-pressure mercury lamp, a medium-pressure mercury lamp, a high-pressure mercury lamp, an ultra-high-pressure mercury lamp, a xenon lamp, and a metal halide lamp, for example. The laser beams and electron beams may also be utilized as the actinic ray for exposure of the film.

Now, the present invention will be described more specifically below with reference to working examples and comparative examples. It should be noted, however, that the following Examples are intended to be merely illustrative of and in any sense restrictive of the present invention. Wherever the term "parts" is used hereinbelow, it shall refer to "parts by weight" unless otherwise specified.

Preparation of Photosensitive Prepolymers

SYNTHESIS EXAMPLE 1

Into a four-necked flask equipped with a stirrer and a reflux condenser, 220 parts of cresol novolak type epoxy resin (manufactured by Dainippon Ink and Chemicals Inc., registered trademark "EPICLON" N-695, epoxy equivalent: 220) was charged and then 214 parts of carbitol acetate was added thereto and they were molten by heating. Then, 0.1 part of hydroquinone as a polymerization inhibitor and 2.0 parts of dimethylbenzylamine as a reaction catalyst were added thereto. The resultant mixture was heated to 95–105° C., 72 parts of acrylic acid was gradually added dropwise thereto, and they were left reacting for 16 hours. The resultant reaction product was cooled to 80–90° C., 106 parts of tetrahydrophthalic anhydride was added thereto, and the mixture was left reacting for 8 hours and cooled, and then the reaction product was extracted therefrom.

The photosensitive resin having ethylenically unsaturated bonds together with carboxyl groups obtained as described above had a nonvolatile content of 65%, an acid value of a solid content of 100 mg KOH/g, and a weight-average molecular weight, Mw, of about 3,500. Hereinafter, this resin solution will be referred to as varnish "a".

Incidentally, the weight-average molecular weight of the obtained resin was determined by gel permeation chromatography connected to pumps manufactured by Shimadzu Seisakusho Ltd., LC-804, KF-803, and KF-802.

SYNTHESIS EXAMPLE 2

Into a flask equipped with a thermometer, a stirrer, a dropping funnel, and a reflux condenser, methyl methacrylate and glycidyl methacrylate were charged in a molar ratio of 4:6 and carbitol acetate as a solvent and azobisisobutyronitrile as a polymerization initiator were added thereto and they were together stirred under an atmosphere of nitrogen gas at 80° C. for 4 hours to obtain a resin solution. The resultant resin solution was cooled and, in the presence of methyl hydroquinone used as a polymerization inhibitor and tetrabutyl phosphonium bromide used as a catalyst, subjected to addition reaction of acrylic acid at a ratio of 100% of the epoxy groups of the resin mentioned above under the conditions of 95–105° C. and 16 hours. The reaction product was cooled to 80–90° C., subjected to the reaction with tetrahydrophthalic anhydride for 8 hours, cooled, and then extracted therefrom.

The photosensitive resin having ethylenically unsaturated bonds together with carboxyl groups obtained as described above had a nonvolatile content of 65%, an acid value of a solid content of 100 mg KOH/g, and Mw of about 15,000. Hereinafter, this resin solution will be referred to as varnish "b".

SYNTHESIS EXAMPLE 3

In 463 parts of dimethyl sulfoxide, 350 parts of a bisphenol A type epoxy resin (EPIKOTE 1004 produced by Japan Epoxy Resin K.K., epoxy equivalent: 917) and 925 parts of epichlorohydrin were dissolved. The resultant solution was kept stirred at 70° C. and 61 parts of 99% NaOH was added meanwhile thereto over a period of 100 minutes. After the addition, the reaction was continued at 70° C. for three hours. After the reaction was completed, the reaction solution was washed with 250 parts of water. After the separation of oil from the mixture, the oil layer was distilled under a reduced pressure to recover the greater part of dimethyl sulfoxide and the excess of unreacted epichlorohydrin. The reaction product containing a residual by-produced salt and dimethyl sulfoxide was dissolved in 750 parts of methyl isobutyl ketone. The resultant solution and 10 parts of 30% NaOH added thereto were left reacting at 70° C. for two hours. After the reaction was completed, the reaction mixture was washed twice with 200 parts of water to separate oil. Thereafter, the oil layer was distilled to recover methyl isobutyl ketone and obtain an epoxy resin having an epoxy equivalent of 318. The epoxy resin thus obtained was found by a calculation based on the epoxy equivalent to have resulted from the epoxidization of about 4.8 of 5.3 alcoholic hydroxyl groups in the bisphenol A type epoxy resin as the starting material mentioned above.

Into a flask, 318 parts of this epoxy resin and 351 parts of carbitol acetate were charged. The mixture was heated and stirred to 90° C. until dissolution. To this solution, 0.4 part of methyl hydroquinone, 72 parts of acrylic acid, and 4 parts of triphenyl phosphine were added and they were heated to 90 to 95° C. and left reacting for 36 hours. Thus, a reaction product having an acid value of 2.2 mg KOH/g was obtained. After this reaction solution was cooled to room temperature, 137 parts of tetrahydrophthalic anhydride was added thereto, and they were heated to 85° C. and left reacting.

The photosensitive resin having ethylenically unsaturated bonds together with carboxyl groups obtained as described above had a nonvolatile content of 60%, an acid value of a solid content of 96 mg KOH/g, and Mw of about 8,800. Hereinafter, this resin solution will be referred to as varnish "c".

The raw materials used in the following working examples and comparative examples are shown in Table 1.

TABLE 1

| | Components | | Chemical name or product name |
|---|---|---|---|
| Main agent | Photosensitive prepolymer | | Varnish "a" obtained in Synthesis Example 1 |
| | | | Varnish "b" obtained in Synthesis Example 2 |
| | | | Varnish "c" obtained in Synthesis Example 3 |
| | Filler | | Silica |
| | Photo-radical polymerization initiator | | 2-Methyl-1-[4-(methylthio)phenyl]-2-morphorino-propan-1-one |
| | Coloring pigment | | Phthalocyanine green |
| | Curing promotor | a | Tetraphenyl phosphonium bromide |
| | | b | Imidazol |
| | | c | Dicyandiamide |
| | Diluent | | Dipropylene glycol monomethyl ether |
| | Silicone-based anti-foaming agent | | KS-66 (manufactured by Shinetsu Chemical Industries Co., Ltd.) |
| | Additive | | Organobentonite |
| Hardner | Photopolymerizable monomer | | Dipentaerythritol hexaacrylate |
| | Epoxy resin | | TEPIC (manufactured by Nissan Chemical Industries Ltd.) |
| | Oxetane resin | a | Terephthalate bisoxetane |
| | | b | Xylylene bisoxetane |
| | Diluent | | Dipropylene glycol monomethyl ether |

EXAMPLES 1–5 AND COMPARATIVE EXAMPLE 1

The main agent solution of each of the examples shown in Table 2 was prepared by compounding relevant components at proportions shown correspondingly in the same table and kneading them with a three-roll mill. The hardener solution of the same example was prepared similarly by compounding relevant components at proportions shown in Table 2 and kneading them with the three-roll mill. A two-package type photocurable and thermosetting resin composition thus obtained was prepared for use by mixing the main agent solution and the hardener solution.

TABLE 2

| Components and amounts (parts) | | | Examples 1 | 2 | 3 | 4 | 5 | Comp. Example 1 |
|---|---|---|---|---|---|---|---|---|
| Main agent | Varnish | a | 100 | — | — | 100 | 100 | 100 |
| | (solid | b | — | 100 | — | — | — | — |
| | content) | c | — | — | 100 | — | — | — |
| | Filler | | 30 | 30 | 30 | 30 | 30 | 30 |
| | Photo-radical polymerization initiator | | 10 | 10 | 10 | 10 | 10 | 10 |
| | Coloring pigment | | 1 | 1 | 1 | 1 | 1 | 1 |
| | Curing | a | — | — | — | — | 3.5 | — |
| | promotor | b | 3.5 | 3.5 | 3.5 | 3.5 | — | 3.5 |
| | | c | — | — | — | — | — | 0.5 |
| | Diluent | | 10 | 10 | 10 | 10 | 10 | 10 |
| | Silicone-based anti-foaming agent | | 1 | 1 | 1 | 1 | 1 | 1 |
| | Additive | | 5 | 5 | 5 | 5 | 5 | 5 |
| Hardener | Photopolymerizable monomer | | 20 | 20 | 20 | 20 | 20 | 20 |
| | Epoxy resin | | — | — | — | — | — | 30 |
| | Oxetane resin | a | 30 | 30 | 30 | — | 30 | — |
| | | b | — | — | — | 30 | — | — |
| | Diluent | | 5 | 5 | 5 | 5 | 5 | 5 |

Evaluation of Quality:

(1) Storage Stability

The two-package type photocurable and thermosetting resin compositions prepared as described above were left standing at 50° C. for one week after mixing and their state at the end of the standing were examined to evaluate the storage stability. As a result, the resin composition of Comparative Example 1 has solidified. On the contrary, the resin compositions of Examples 1 to 5 have maintained their liquid state without causing gelation. To be specific, this means that the resin composition of the present invention excels in storage stability and can be formulated as a one package preparatin.

(2) Developability

The photocurable and thermosetting resin compositions obtained in Examples 1–5 and Comparative Example 1 were each applied by the screen printing method onto the entire surface of a copper-clad substrate and then dried by heating at 80° C. for 30 minutes. Each substrate was entirely exposed to light by using a high pressure mercury lamp through a negative film with a prescribed exposure dose and then developed with an aqueous 1 wt % $Na_2CO_3$ solution used as a developing solution under the condition of a spraying pressure of 2 kg/cm² for one minute to form a resist pattern thereon. The developability was visually examined through a microscope and rated on the following criterion.

◎: Complete development even in very small portions

○: Presence of thin undevelopped portions in the substrate surface

Δ: Remarkable presence of undevelopped portions

×: Almost no development (3) Adhesiveness:

The photocurable and thermosetting resin compositions obtained in Examples 1–5 and Comparative Example 1 were each applied by the screen printing method onto the entire surface of a printed circuit board having a prescribed pattern formed in advance thereon to form a coating film of about 20 μm tickness. Then, a resin pattern was formed under the same conditions as in the test for developability in item (2) mentioned above. The resultant substrate was thermally cured at 150° C. (in the case of Comparative Example) or 180° C. (in the cases of Examples 1 to 5) for one hour to prepare a test substrate. This test substrate was incised like cross-cut in the shape of squares in a go board and then subjected to a peel test with a cellophane adhesive tape in accordance with the method specified in JIS D-0202 to determine the degree of separation of the resist layer based on the following criterion.

◎: 100/100 and absolutely no peeling of the resist layer

○: 100/100, but slight peeling in cross-cut portions

Δ: 50/100–90/100

×: 0/100–50/100

(4) Resistance to Cracking

Test substrates were prepared under the same conditions as in the test for adhesiveness in item (3) mentioned above by using the photocurable and thermosetting resin compositions obtained in Examples 1–5 and Comparative Example 1. These test substrates were subjected to the heat cycle test under the conditions of 1,000 cycles between 125° C.×30 minutes and −55° C.×30 minutes to investigate the occurrence of cracks.

(5) Resistance to Soldering Heat

Test substrates were prepared under the same conditions as in the test for adhesiveness in item (3) mentioned above by using the photocurable and thermosetting resin compositions obtained in Examples 1–5 and Comparative Example 1. Each of the test substrates was coated with a rosin type flux, immersed for 30 seconds in a solder bath set in advance at 260° C., then rinsed with isopropyl alcohol to remove the flux therefrom, and visually examined to find the extents of swelling, separation, and discoloration consequently produced in the resist layer on the test substrate.

◎: Perfect absence of any discernible change was found.

○: Slight change was found.

Δ: Swelling or separation of a coating film was not more than 20%.

×: Swelling or separation of a coating film was not less than 20%.

The results of the above tests are collectively shown in Table 3.

TABLE 3

| Properties | Examples |  |  |  |  | Comp. Example |
|---|---|---|---|---|---|---|
|  | 1 | 2 | 3 | 4 | 5 | 1 |
| Developability | ◉ | ◉ | ○ | ◉ | ◉ | ◉ |
| Adhesiveness | ◉ | ○ | ◉ | ◉ | ○ | ◉ |
| Resistance to cracking | N | N | N | N | N | Y |
| Resistance to soldering heat | ◉ | ○ | ◉ | ◉ | ○ | ◉ |

Remarks
N: Absence of cracks
Y: Presence of cracks
The thermal curing was carried out at a most suitable curing temperature for epoxy resin or oxetane resin (epoxy resin: 150° C., oxetane resin: 180° C.).

As being clear from the results shown in Table 3, the photocurable and thermosetting resin compositions of the present invention obtained in Examples 1 to 5 excelled in storage stability as compared with the conventional composition and cured films excelling in resistance to cracking were obtained without causing deterioration of the properties of the conventional cured film. Incidentally, the insulation resistance measured was the same results as that obtained by the conventional cured film.

Preparation of Photosensitive Dry Film

The following components including the photosensitive prepolymer obtained in each of Synthesis Examples 1 to 3 (varnish a, b, and c) were kneaded with a three-roll mill to prepare the photocurable and thermosetting resin composition so as to have the formulation shown in the following Examples 6 to 8 and Comparative Example 2. Then, the resultant composition was applied to a supporting film (PET film) thereby forming a coating film so as to give a dry film thickness of 40 μm and then dried at 80° C. for 20 minutes. Thereafter, a polyethylene (PE) film of 20 μm was laminated thereon as a protective film to prepare a photosensitive dry film

EXAMPLE 6

| | |
|---|---|
| Photosensitive prepolymer: varnish "a" | 100 parts |
| Photo-radical polymerization initiator: Irgacure 907 (produced by Ciba Specialty Chemicals Ltd.) | 10 parts |
| Coloring pigment: phthalocyanin green | 1 part |
| Filler: barium sulfate | 30 parts |
| Additive: | 5 parts |
| Photopolymerizable monomer: dipentaerythritol hexaacrylate | 20 parts |
| Oxetane compound: xylylene bisoxetane (produced by Toa Gosei K.K.) | 30 parts |
| Curing promotor: tetraphenyl phosphonium bromide | 2 parts |
| Diluent: dipropylene glycol monomethyl ether | 5 parts |
| Total | 203 parts |

EXAMPLES 7 and 8

The composition has the same components as those in Example 6 except that the photosensitive prepolymer is changed to varnish "b" and varnish "c", respectively.

COMPARATIVE EXAMPLE 2

| | |
|---|---|
| Photosensitive prepolymer: varnish "a" | 100 parts |
| Photo-radical polymerization initiator: Irgacure 907 (produced by Ciba Specialty Chemicals Ltd.) | 10 parts |
| Coloring pigment: phthalocyanin green | 1 part |
| Filler: barium sulfate | 30 parts |
| Additive: | 5 parts |
| Photopolymerizable monomer: dipentaerythritol hexaacrylate | 20 parts |
| Epoxy compound: TEPIC (produced by Nissan Chemical Industries, Ltd.) | 30 parts |
| Curing promotor: dicyandiamide | 2 parts |
| Diluent: dipropylene glycol monomethyl ether | 5 parts |
| Total | 203 parts |

Transfer to a Substrate:

The dry film layer of the photosensitive dry film was transferred by separating the protective film from the photosensitive dry film, hot press bonding the photosensitive surface thereof (dry film layer side) onto a substrate by the use of a laminator, and separating the supporting film from the substrate.

Formation of Pattern:

The above-mentioned dry film layer transferred onto the substrate, with a negative mask of a prescribed pattern superposed thereon, was exposed to light with the exposure dose of 500 mJ/cm², then developed with an aqueous 1 wt. % sodium carbonate solution by spraying for 90 seconds to remove the unexposed areas, and thermally cured at 180° C. for 60 minutes in the case of Examples 6–8 and at 150° C. for 60 minutes in the case of Comparative Example 2, respectively, to form a pattern.

Evaluation of Quality:

(5a) Resistance to Soldering Heat

The dry film layer of each of the photosensitive dry films prepared by using the compositions of Examples 6 to 8 and Comparative Example 2 was transferred onto the substrate by the transferring method mentioned above and thermally cured at 180° C. for 60 minutes in the case of Examples 6–8 and at 150° C. for 60 minutes in the case of Comparative Example 2, respectively, to prepare a test substrate.

This test substrate was visually examined to find the extents of swelling, separation, and discoloration consequently produced in the transferred layer on the test substrate in the same manner as in the test for resistance to soldering heat in item (5) mentioned above. The rating criterion is the same as that in the resistance to soldering heat in item (5) mentioned above.

(1a) Storage Stability

The dry film layers of the photosensitive dry films prepared by using the compositions of Examples 6 to 8 and Comparative Example 2 were transferred onto the substrates by the transferring method mentioned above to prepare test substrates. These test substrates were kept in a thermo-hygrostat at −20° C., 0° C., and 20° C., respectively. Each test substrate was taken from the thermo-hygrostat after 7 days, exposed to light and developed according to the predetermined manner to test for developability, and confirmed the storage stability through a microscope on the following criterion.

◉: Complete development even in very small portions
○: Presence of thin undevelopped portions in the substrate surface
Δ: Remarkable presence of undevelopped portions
×: Almost no development (3a) Adhesiveness Test substrates were prepared under the same conditions as in the test for resistance to soldering heat in item (5a) mentioned above and evaluated according to the same testing method and criterion as in the test for adhesiveness in item (3) mentioned above.

The results of the above tests are collectively shown in Table 4.

TABLE 4

| Properties | | Examples | | | Comparative Example |
|---|---|---|---|---|---|
| | | 6 | 7 | 8 | 2 |
| Developability | | ⊚ | ⊚ | ⊚ | ⊚ |
| Adhesiveness | | ⊚ | ⊚ | ⊚ | ⊚ |
| Storage stability | −20° C. | ⊚ | ⊚ | ⊚ | ⊚ |
| | 0° C. | ⊚ | ⊚ | ⊚ | ○ |
| | 25° C. | ⊚ | ⊚ | ⊚ | X |

As being clear from the results shown in Table 4, the photosensitive dry films prepared by using the photocurable and thermosetting resin compositions of the present invention remarkably excelled in storage stability at room temperature as compared with that prepared by using the conventional composition.

As described above, the photocurable and thermosetting resin composition of the present invention enjoys longer shelf life (useful life), can be formulated as a one package preparation, excels in formation of fine patterns, storage stability, and developability, and is capable of producing a cured product excelling in various properties such as resistance to cracking (toughness), fastness of adhesion, and hardness. Accordingly, it is useful as coating materials, printing ink, adhesives, resist materials, and the like, particularly as solder resists for printed circuit boards. Further, since the photosensitive dry film of the present invention prepared by using such a photocurable and thermosetting resin composition excels in storage stability at room temperature and has various advantages owing to the excellent properties as mentioned above, it is useful as various resist materials and electrical insulating materials, particularly as solder resists for printed circuit boards, interlaminar insulating materials for build-up multi-layer printed circuit boards, and the like.

While certain specific embodiments and working examples have been disclosed herein, the invention may be embodied in other specific forms without departing from the spirit or essential characteristics thereof. The described embodiments and examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A photosensitive dry film, characterized by comprising a supporting film and at least a dry film layer of a photocurable and thermosetting resin composition formed thereon and comprising (A) a photosensitive prepolymer having a carboxyl group in combination with at least two (meth) acrylol groups in its molecule, (B) a polymerization initiator, (C) a diluent, (D) an oxetane compound having at least two oxetanyl groups in its molecule, and (E) a curing promotor.

2. The photosensitive dry film according to claim 1, further comprising a protective film laminated on said dry film layer.

3. The photosensitive dry film according to claim 1, further comprising a water-soluble resin layer and a cover film laminated on said dry film layer in the order mentioned.

4. A method of forming a pattern, characterized by comprising the steps of tightly superposing said photosensitive dry film according to claim 1 on a substrate on which a pattern is formed in such a manner that a dry film layer is brought into contact with the substrate, separating a supporting film from the dry film layer, then exposing the layer to light through a patterned mask, and effecting development to remove an unexposed area of the layer.

5. A method of forming a pattern, characterized by comprising the steps of separating a protective film from said photosensitive dry film according to claim 2, tightly superposing the photosensitive dry film on a substrate on which a pattern is formed in such a manner that a dry film layer is brought into contact with the substrate, separating a supporting film from the dry film layer, then exposing the layer to light through a patterned mask, and effecting development to remove an unexposed area of the layer.

* * * * *